United States Patent [19]

Sugano et al.

[11] Patent Number: 5,290,731
[45] Date of Patent: Mar. 1, 1994

[54] ALUMINUM METALLIZATION METHOD

[75] Inventors: Yukiyasu Sugano; Shinji Minegishi; Kazuhide Koyama; Hirofumi Sumi, all of Kanagawa, Japan

[73] Assignee: Sony Corporation, Tokyo, Japan

[21] Appl. No.: 848,123

[22] Filed: Mar. 9, 1992

[30] Foreign Application Priority Data

Mar. 7, 1991 [JP] Japan .................................. 3-067997

[51] Int. Cl.$^5$ ......................................... H01L 21/441
[52] U.S. Cl. .................... 437/174; 437/190; 437/192; 437/194; 437/200; 437/195
[58] Field of Search ............... 437/190, 192, 194, 195, 437/970, 977, 200, 173, 174; 148/DIG. 138

[56] References Cited

U.S. PATENT DOCUMENTS 4,782,380  11/1988  Shankar et al. .................. 437/190 X
4,784,973  11/1988  Stevens et al. .................. 437/190 X
5,162,262  11/1992  Ajika et al. ..................... 437/190 X

FOREIGN PATENT DOCUMENTS 113421    5/1987  Japan .................................. 437/190
2-260630  10/1990 Japan .
185722    8/1991  Japan .................................. 437/190

OTHER PUBLICATIONS

*Semiconductor World*, Dec. 1989, pp. 186-188, (Japanese).
Hariu et al., "The Properties of Al-Cu/Ti Films Sputter Deposited at Elevated Temperatures and High DC Bias", *IEEE/IRPS*, Dec. 1989, pp. 210-214.
*Extended Abstracts of the 37th Spring Meeting (1990) of the Japanese Society of Applied Physics and Related Societies*, vol. 2, p. 592, Subject 29a-ZA-10, (Japanese).
*Invention Association Technical Reports*, Publication No. 90-16909, Sep. 20, 1990, (Japanese).

Primary Examiner—John S. Maples
Attorney, Agent, or Firm—Hill, Steadman & Simpson

[57] ABSTRACT

A metallization method for improving wettability and reactivity of a titanium (Ti) based barrier metal layer with respect to an aluminum (Al) based material and simultaneously achieving high barrier properties and superior step coverage, is proposed. An operation of increasing the crystal grain size of and planarizing at least a surface region of a barrier metal layer is effected simultaneously at the time of formation of a barrier metal layer. In this manner, Al migration characteristics and reactivity on a barrier metal surface are improved so that voids are not produced when an Al-based material layer is charged into small-sized connecting hole by a process sensitive to surface morphology, such as high temperature bias sputtering. By this technique, wettability of a material layer having distinctly inferior wettability with Al, while being excellent in barrier properties, such as a TiON layer, may be improved. As a smoothing operation, bias sputtering, laser irradiation and lamp annealing are proposed. Satisfactory results have been achieved on applying these to a Ti/TiON/Ti system, a Ti/TiON system or to a Ti/TiON/TiSi$_2$ system.

7 Claims, 7 Drawing Sheets

ALUMINUM METALLIZATION METHOD

BACKGROUND OF THE INVENTION

1. Field of the Invention

This invention relates to a metallization method for the preparation of semiconductor devices. More particularly, it relates to a method enabling an aluminum (Al) based material to be uniformly buried in a connecting hole coated by a barrier metal layer inclusive of a layer of a titanium (Ti) based material.

2. Description of the Related Art

With increasingly refined design rule for semiconductor devices, as exemplified by VLSIs and ULSIs of recent origin, the diameter of the connecting hole bored in an interlayer insulating layer for establishing connection between upper metallization and lower metallization is also refined, with the aspect ratio occasionally exceeding unity. The upper metallization is usually formed by depositing an Al-based material by sputtering. However, sufficient step coverage can be achieved difficultly for burying the connecting hole having such a high aspect ratio, frequently leading to disconnections.

As a measure for improving step coverage, a high temperature bias sputtering method has recently been proposed. As introduced in Monthly Semiconductor World, published by Press Journal Co. Ltd., 1989, December issue, pages 186 to 188, and in IEEE/IRPS, 1989, pages 210 to 214, this technique resides in effecting sputtering by heating a wafer to hundreds of degrees Centigrade by means of a heater block and by applying an RF bias by means of the heater block. It is possible with this method to improve step coverage to produce an Al-based material layer having a planar surface by Al reflow effect and ion bombardment by application of the bias power. It has been reported in these treatises that, if a Ti layer is provided as a layer underlying the Al-based material layer, the Ti layer contributes to surface migration of Al atoms to achieve superior step coverage.

Needless to say, the Ti layer provided as a layer underlying the Al-based material layer is used in expectation of its function as a barrier metal layer. However, the Ti layer, while being a superior contact material in achieving a low resistance ohmic contact, cannot fulfil the function as a barrier metal layer satisfactorily. The reason is that, even if the Ti layer is provided alone between the Si substrate and the Al-based material layer, both the reaction between Si and Ti and the reaction between Ti and Al proceed simultaneously, so that Al spikes into the Si substrate cannot be prevented. For this reason, a TiN layer is superimposed on the Ti layer to provide a double-layer barrier metal system (Ti/TiN system). In recent years, a Ti/TiON double-layer barrier metal system is also proposed, in which $O_2$ is introduced at the time of TiN growth to convert it to TiON. The purpose of the double-layer structure is to segregate oxygen in the TiN grain boundary for further improving the effect of preventing diffusion of Al in the grain boundary.

However, during high temperature sputtering, the Al-based material is in an intermediate state between the solid and the liquid and is highly sensitive to surface morphology or structure of the underlying layer. If such Ti/TiON based barrier metal layer is previously formed in the contact region, difficulties are presented in uniform burial of the connecting hole, even if it is attempted to deposit the Al-based material layer by high temperature bias sputtering.

For example, in the case of a substrate in which a Ti layer 2 and a TiON layer 3 are sequentially deposited as a barrier metal layer on an interlayer insulating film 1, an Al-based material 6, deposited on the substrate by high temperature bias sputtering, is not fluidized sufficiently on the TiON layer 3. The reason is that, as shown schematically in FIG. 1, the TiON layer 3 has a columnar crystal structure with a grain size of 5 to 20 nm and exhibits rough surface morphology or structure so that it is inferior in reactivity and wettability with respect to the Al-based material 6. The present inventors made attempts to lower the deposition rate to about one half the customary deposition rate, with a view to promoting the reaction in an interface between the TiON layer 3 and the Al-based material 6. However, it was found that the burial characteristics were not improved.

For overcoming such problem, the present inventors also made attempts to stack a Ti layer inherently superior in wettability and reactivity with respect to Al on the TiON layer 3 to provide a three-layered barrier metal layer 5 composed of the Ti layer 2, the TiON layer 3 and a Ti layer 4 as shown in FIG. 2. However, deposition of the Ti layer 4 merely resulted in accentuated surface roughnesses so that the Al-based material 6 could not be fluidized satisfactorily on the surface of the Ti layer 4.

FIGS. 3a and 3b illustrate what inconveniences are produced when the state explained with reference to FIGS. 1 and 2 is actually produced in the vicinity of a contact hole. In FIGS. 3a and 3b, parts or components similar to those shown in FIGS. 1 and 2 are indicated by the same reference numerals.

Referring to FIG. 3a, a wafer is shown in which an interlayer insulating film 11 having a contact hole 10 reaching an impurity diffusion layer 9 previously formed in a silicon substrate 8 is formed on the silicon substrate 8, and in which a Ti/TiON barrier metal layer 7 or a Ti/TiON/Ti barrier metal layer 5 is formed for covering the entire substrate surface.

However, since both the barrier metal layers 5, 7 exhibit rough surface morphology, the Al-based material 6, deposited thereon by high temperature bias sputtering, cannot be fluidized sufficiently in the vicinity of the opening end of the contact hole 10. If the Al-based material 6 continues to be deposited further in this state, voids 11 tend to be produced in the bulk material, even although the contact hole 10 appears to have been buried in the Al-based material 6. Besides, since a large number of nuclei about which the Al-base material 6 starts to be grown are generated at a time on the rough surface, the crystal grains of the Al-based material layer 6 tend to be refined to deteriorate resistance to electromigration.

Object and Summary of the Invention

In view of difficulties met in the prior art technique for simultaneously achieving high barrier characteristics and superior step coverage, it is an object of the present invention to provide a metallization method capable of satisfying these requirements simultaneously.

According to the present invention, there is provided an operation of increasing the crystal grain size of a barrier metal layer at its surface region in a part of the steps of forming the barrier metal layer.

The number of the Ti-based material layer(s) in the barrier metal layer may be one or more. In the latter case, several process patterns may be undertaken depending on at which stage the operation of increasing the crystal grain size is to be performed. If the operation is performed at the last stage of formation of the barrier metal layer, not only the crystal grain size of the upper most Ti-based material layer is increased, but, depending on the type of the operation, the crystal grain size of the underlying Ti-based material is also increased under the effect of the operation or the crystal grain size of the upper most several layers is increased as a result of the accompanying alloying reaction. If the operation is effected in the course of formation of the barrier metal layer, the Ti-based material layer stacked on an occasionally upper most layer is increased in crystal grain size because surface structure of morphology of the latter layer is improved.

At any rate, according to the present invention, crystal grains have been grown in a surface region of the barrier metal layer, so that surface morphology is improved. Thus, even when the Al-based material is deposited by a process sensitive to surface morphology, such as high temperature bias sputtering, the material may be improved in fluidity to prevent voids from being produced. Barrier characteristics may also be improved because such increase in crystal grain size leads to suppression of diffusion of Al in the grain boundary in the Ti-based material. Besides, metallization with high reliability with improved resistance to electro-migration may be realized because the crystal grain size of the Al-based material layer deposited on the barrier metal layer is also increased.

According to the present invention, bias sputtering, laser irradiation and lamp annealing are proposed as means for realization of the above mentioned increased crystal grain size.

With bias sputtering, since film deposition and planarization proceed competitively, a dense Ti-based material layer may be produced. Crystal grain size of another Ti-based material, occasionally stacked on the Ti-based material, may also be increased.

Past investigations have indicated that the crystal grain size may be increased by laser beam irradiation. One of the present inventors revealed a research concerning the growth of the crystal grains of titanium silicide $TiSi_2$ to 2.5 to 10 μm by XeCl excimer irradiation in Extended Abstracts of the 37th Spring Meeting (1990) of the Japan Society of Applied Physics and Related Societies, Vol. 2, p. 592, 29a-ZA-10. If the laser power is larger to some extent, not only the Ti-based material layer constituting the upper most layer of the barrier metal layer, but also the underlying Ti-based material layer may be increased in crystal grain size, or planarized.

By lamp annealing, several surface layers of the barrier metal layer may be alloyed to increase the crystal grain size of the surface region of the barrier metal layers.

Meanwhile, as to the technology concerning laser irradiation effected in accordance with the present invention, the present Assignee has disclosed in Invention Association, Technical Report, Publication No. 90-16909 a technique of melting and smoothing the surface of TiN(111) film by excimer laser irradiation. However, this TiN(111) film is deposited so as to be used simultaneously as a barrier layer for enabling growth of single crystals of the upper Al metallization after the connecting hole bored in the interlayer insulating film is planarized by a plug material such as polysilicon or tungsten (W). Thus the TiN(111) layer is not formed in the connecting hole. Conversely, in accordance with the present invention, a variety of operations, inclusive of laser irradiation, are effected on the barrier metal layer, with a view to achieving uniform burial of the connecting hole by the Al-based material, thus in a manner different in both the objective and effect from the above technique.

Thus the present invention is highly effective for producing semiconductor devices which are designed based on the minute design rule and which are required to satisfy the requirements of high integration degree, high performance and high reliability.

BRIEF DESCRIPTION OF THE DRAWINGS

FIGS. 3a and 3b are schematic cross-sectional views for illustrating problems inherent in the conventional metallization method, wherein FIG. 3a shows an initial state of burial of the contact hole and FIG. 3b shows a state in which the contact hole is not buried satisfactorily but voids are produced.

FIG. 4a shows the state in which a lower Ti layer has been formed on an interlayer insulating film,. FIG. 4b shows the state in which a TiON layer has been formed by bias sputtering, FIG. 4c shows the state in which an upper Ti layer has been formed and FIG. 4d shows the state in which the Al-1% Si layer on the barrier metal layer has been fluidized satisfactorily.

FIG. 5a shows the state in which a Ti layer and a TiON layer have been sequentially formed on an interlayer insulating film, FIG. 5b shows the state in which the TiON layer has been coarsened in crystal grain size and planarized by laser irradiation and FIG. 5c shows the state in which the Al-1% Si layer has been fluidized satisfactorily on the barrier metal layer.

FIG. 6a shows the state in which a lower Ti layer, a TiON layer and an upper Ti layer have been sequentially formed on an interlayer insulating film, FIG. 6b shows the state in which at least the upper Ti layer has been coarsened in crystal grain size and planarized by laser irradiation and FIG. 6c shows the state in which the Al-1% Si layer has been fluidized satisfactorily on the barrier metal layer.

FIG. 7a shows the state in which a lower Ti layer, a TiON layer, a polysilicon layer, a silicon oxide layer and an upper Ti layer have been sequentially formed on an interlaying insulating film, FIG. 7b shows the state in which the TiSi$_2$ layer has been formed by lamp annealing and FIG. 7c shows the state in which the Al-1% Si layer has been fluidized satisfactorily on the barrier metal layer.

DETAILED DESCRIPTION OF THE INVENTION

Figure 1:
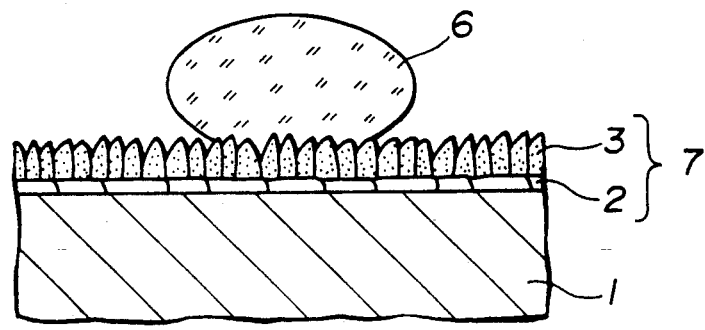
FIG. 1 is a schematic cross-sectional view showing the state of the conventional metallization method in which the Al-based material is not fluidized sufficiently on a TiON layer.

Preferred embodiments of the present invention will be explained hereinbelow by referring to FIGS. 4 to 8, in which common parts are indicated by the same reference numerals.

Example 1

In the present Example, a TiON layer is formed by bias sputtering, in the course of formation of a barrier metal layer of the Ti/TiON/Ti system, for coarsening the crystal grain size of the overlying Ti layer. This process is explained by referring to FIGS. 4a to 4d.

Figure 4A:
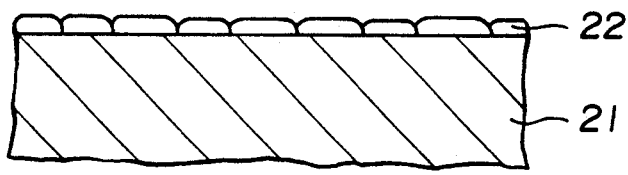
FIGS. 4a to 4d are schematic cross-sectional views showing an example of application of the present invention, step by step, where

First, as shown in FIG. 4a, a lower Ti layer 22 about 30 nm thick was formed by sputtering on an interlayer insulating film 21 of e.g. silicon oxide under typical conditions of an Ar flow rate of 100 SCCM, a gas pressure of 0.47 Pa (3.5 mTorr), a dc sputtering power of 4 kW and a substrate temperature of 150° C. As shown schematically in FIG. 4a, the lower Ti layer 22 is coarser in crystal grain size and exhibits planar surface morphology.

Figure 4B:
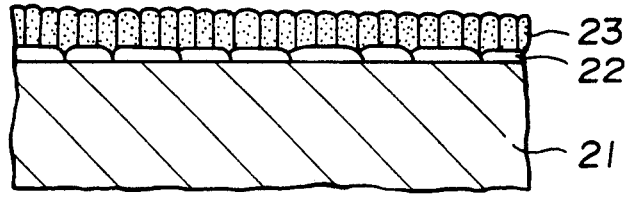

Then, as shown in FIG. 4b, a TiON layer 23 about 70 nm thick was stacked on the lower Ti layer 22 by bias sputtering under exemplary conditions of an Ar flow rate of 40 SCCM, an N$_2$-6% O$_2$ mixed gas flow rate of 70 SCCM, a gas pressure of 0.47 Pa (3.5 mTorr), a dc sputtering power of 5 kW, a substrate temperature of 150° C. and an RF sputtering power of 100 W (13.56 MHz). During this bias sputtering process, film deposition proceeded competitively with planarization under the reverse-sputtering effect, so that, as schematically shown in FIG. 4b, the TiON layer 23 having a relatively planar surface morphology was produced. The TiON layer 23 exhibits surface morphology markedly different from that of the TiON layer 3 shown schematically in FIG. 1.

Figure 2:
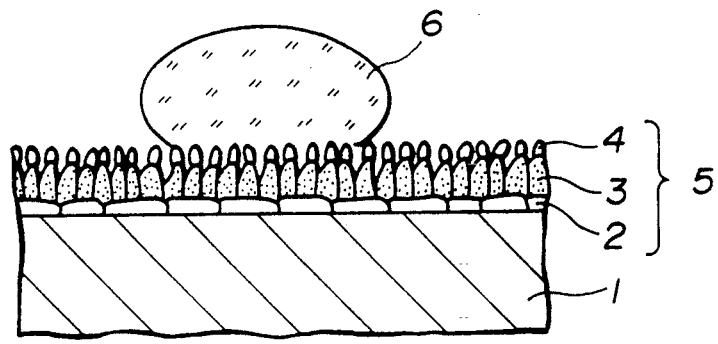
FIG. 2 is a schematic cross-sectional view showing the state of the conventional metallization method in which the Al-based material is not fluidized sufficiently on an upper Ti layer.
Figure 4C:
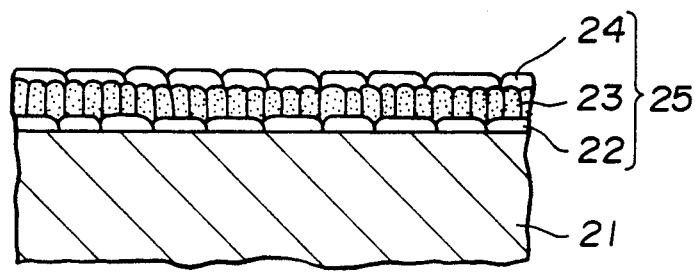

Then, as shown in FIG. 4c, an upper Ti layer 24 was deposited by sputtering to a thickness of about 30 nm on the TiON layer 23 under the same conditions as those used for deposition of the lower Ti layer 22. Since the underlying TiON layer 23 exhibits satisfactory surface morphology, the upper Ti layer 24 was deposited with larger crystal grain size, similarly to the lower Ti layer 22. The crystal grain size of the upper Ti layer 24 is substantially coarser than that of the Ti layer 4 shown schematically in FIG. 2.

Figure 4D:
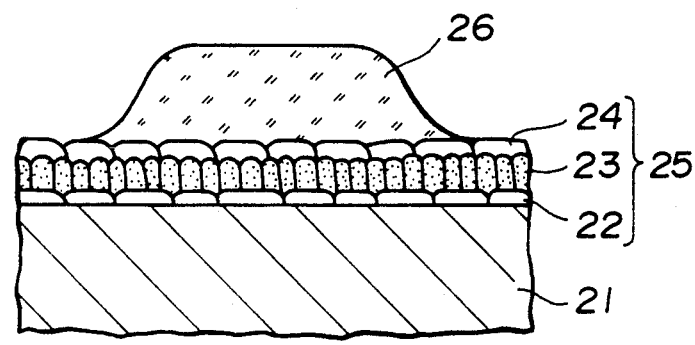

On a barrier metal layer 25, constituted by the thus formed lower Ti layer 22, the TiON layer 23 and the upper Ti layer 24, reactivity and wettability with respect to the Al-1%Si material layer 26 were improved significantly, as indicated in FIG. 4d.

The present invention is not limited to the above Example. Thus, rare gases such as Ar may be contained in an atmosphere employed during deposition of the TiON layer 23. The sputtering power may be suitably set in the range of about 50 to 300 W as long as sufficient planarization may be expected to be achieved and the underlying layer is not damaged. Besides, a TiN layer or a TiW layer may also be deposited by bias sputtering in place of the TiON layer 23 for achieving similar effects.

Example 2

In the present Example, an excimer laser is irradiated after formation of the TiON layer during the formation of the Ti/TiON system barrier metal layer for planarizing and coarsening the crystal grain size of the TiON layer. This process is explained by referring to FIGS. 5a to 5c.

Figure 5A:
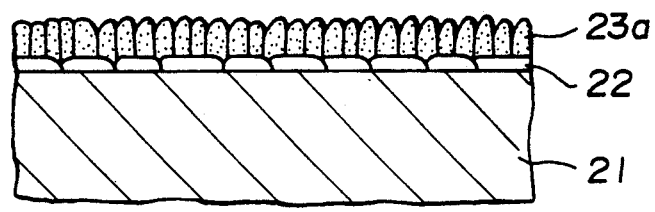
FIGS. 5a to 5c are schematic cross-sectional views showing another example of application of the present invention, step by step, where
Figure 5B:
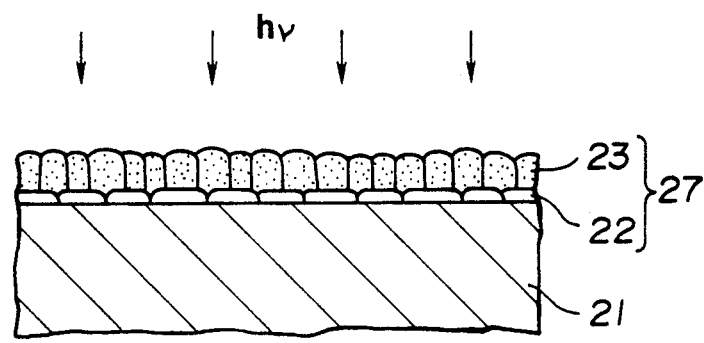

First, as shown in FIG. 5a, a lower Ti layer 22 about 50 nm thick and a TiON layer 23a about 100 nm thick were sequentially stacked by sputtering on an interlayer insulating film 21, as shown in FIG. 5a. The lower Ti layer 22 was deposited under the conditions which were the same as those shown in Example 1.

On the other hand, the TiON layer 23a was deposited under the conditions which were the same as those shown in Example 1 except that the RF bias power was not applied. In short, the TiON layer 23a was deposited by ordinary sputtering instead of by bias sputtering. Thus the surface morphology was as rough as that achieved with the conventional method shown in FIG. 1. In the following description of the present specification, layers not coarsened or planarized are indicated by reference numerals added to by suffix letters a.

Then, by irradiating with an XeCl excimer laser under conditions of a laser power of 32 W, an energy density of 1000 mJ/cm$^2$ and an irradiation time duration of 20 nsec for planarizing and coarsening the crystal grain size of the TiON layer 23a for providing the TiON layer 23.

Figure 5C:
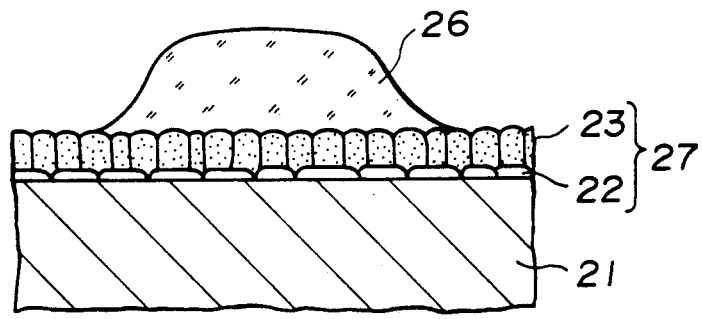

On a barrier metal layer 27, constituted by the thus formed lower Ti layer 22 and the TiON layer 23, reactivity and wettability with respect to the Al-1% Si material layer 26 were improved significantly, as indicated in FIG. 5c.

The present invention is not limited to the above Example. Thus the laser irradiation may be effected using excimer laser beam sources other than XeCl or ordinary UV laser light sources may also be used, if an energy density of not lower than about 800 mJ/cm$^2$ is thereby achieved.

Example 3

In the present Example, an excimer laser is irradiated after formation of the upper Ti layer during the formation of the Ti/TiON/Ti system barrier metal layer for planarizing and coarsening the crystal grain size of at least the upper Ti layer. This process is explained by referring to FIGS. 6a to 6c.

Figure 6A:
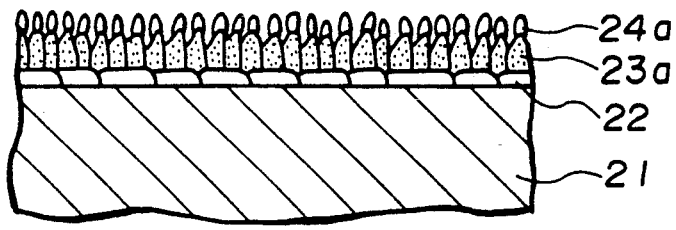
FIGS. 6a to 6c are schematic cross-sectional views showing a further example of application of the present invention, step by step, where
Figure 6B:
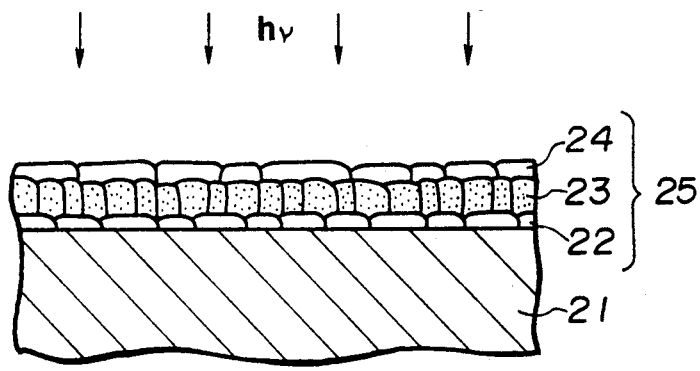

First, as shown in FIG. 6a, a lower Ti layer 22 about 30 nm thick, a TiON layer 23a about 70 nm thick and an upper Ti layer 24a about 30 nm thick were sequentially stacked by sputtering on an interlayer insulating film 21 of, for example, of silicon oxide, as shown in FIG. 6a. The lower Ti layer 22 and the upper Ti layer 24a were deposited under the conditions which were the same as those shown in Example 1, while the TiON layer 23a was deposited under the conditions similar to those shown in Example 2. At this stage, the TiON layer 23a and the upper Ti layer 24a exhibited rough surface morphology.

Then, an XeCl excimer laser was irradiated under conditions of a laser power of 32 W, an energy density of 1000 mJ/cm$^2$ and an irradiation time duration of 20 nsec for planarizing and coarsening the crystal grain size of the upper Ti layer 24a under the annealing effect for providing the upper Ti layer 24. If the laser power is not so high, only the upper Ti layer 24a can be planarized. However, under the above irradiation conditions, the underlying TiON layer 23a was also annealed and thereby planarized and coarsened in crystal grain size to provide the TiON layer 23.

Figure 6C:
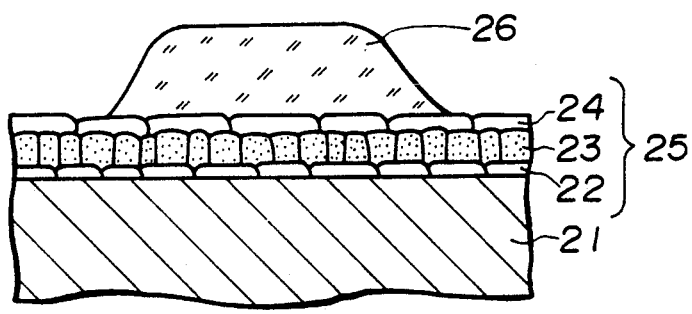

On the barrier metal layer 25, consisting of the lower Ti layer 22, TiON layer 23 and the upper Ti layer 24, reactivity and wettability of the Al-1%Si material layer 26 were improved significantly, as indicated in FIG. 6c.

Example 4

In the present example, generation of TiSi$_2$ and increase of the crystal grain size were achieved simultaneously by lamp annealing during the formation of the Ti/TiON/TiSi$_2$ system barrier metal layer. This process will be explained by referring to FIGS. 7a to 7c.

Figure 7A:
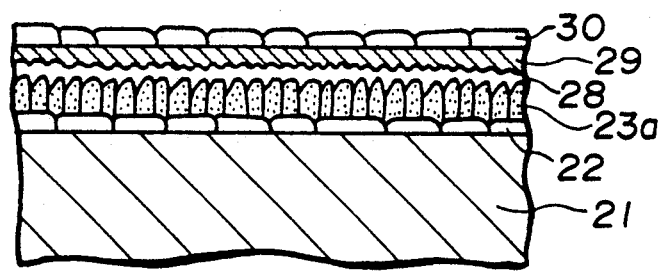
FIGS. 7a to 7c are schematic cross-sectional views showing a still further example of application of the present invention, step by step, where

First, as shown in FIG. 7a, a lower Ti layer 22 about 30 nm in thickness and a TiON layer 23a about 70 nm in thickness were deposited on an interlayer insulating film 21 of e.g. silicon oxide under conditions shown in Example 2. Then, a polysilicon layer 28, about 20 nm in thickness was deposited by e.g. CVD, and a silicon oxide layer 29 was formed to a thickness of the order of 5 nm by thermal oxidation on the surface of the polysilicon layer 28. An upper Ti layer 30 was finally deposited under the depositing conditions similar to those given above in connection with the lower Ti layer 22.

Figure 7B:
Figure 7B:
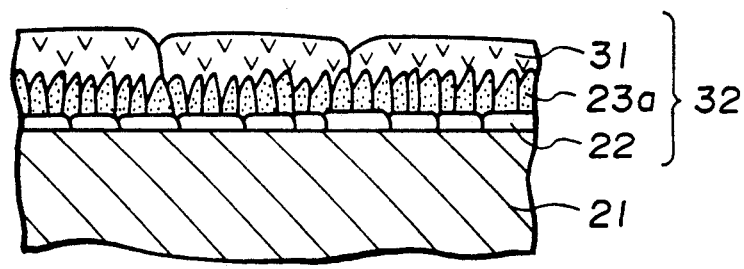

A siliciding reaction was then carried out by a two-stage lamp annealing. Thus, a first-stage lamp annealing was carried out in an Ar atmosphere at about 600° C. for reacting a part of the upper Ti layer 30 with the polysilicon layer 28 via the silicon oxide layer 29 for forming a TiSi layer, not shown. Then, using a mixed solution of ammonia and hydrogen peroxide, non-reacted portions of the upper Ti layer 30 were selectively removed by wet etching. A second-stage lamp annealing was then carried out at about 800° C. for further reacting the TiSi layer with the polysilicon layer 28 for forming a TiSi$_2$ layer 31, which is formed of coarse crystal grains and which exhibits a planar surface, as indicated in FIG. 7b.

Meanwhile, the siliciding method is an improved method with respect to the conventional process of generating a self-aligned silicide (SALICIDE). With the siliciding method, the Ti layer is not deposited directly on the silicon based material for subsequent heat treatment, but the Ti layer is stacked on the silicon based material layer via a silicon oxide layer, after which a siliciding heat treatment is carried out in an inert gas atmosphere. This process is disclosed in detail in JP Patent KOKAI Publication No. 2-260630 (1987) by the present Assignee, and a term SITOX (=silicidation through oxide) is proposed because the siliciding reaction is carried out through an oxide layer.

In addition, lamp annealing is effected in two stages as mentioned above for achieving improved controllability of the siliciding reaction.

Figure 7C:
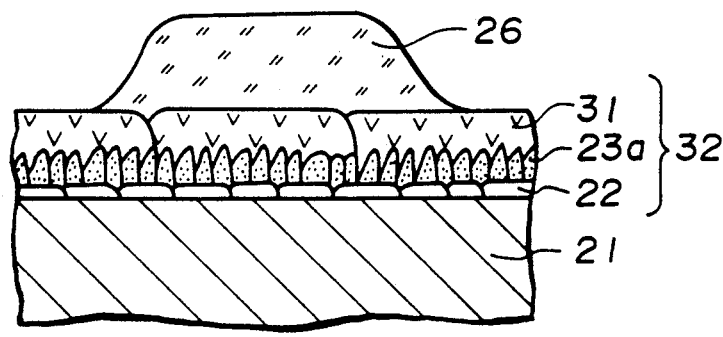

On a barrier metal layer 32, constituted by the thus formed lower Ti layer 22, TiON layer 23a and the TiSi$_2$ layer 31, reactivity and wettability with respect to the Al-1% Si material layer 26 were improved significantly, as indicated in FIG. 7c. Meanwhile, electric resistivity of TiSi$_2$ is about 12 $\mu\Omega$·cm which is much lower than 55 $\mu\Omega$·cm of Ti, so that the TiSi$_2$ layer 31 is also meritorious from the viewpoint of improving resistance to electro-migration.

It will be seen from above that the Al-1% Si layer 26 exhibit superior wettability and reactivity on the barrier metal layers 25, 27 and 32 produced in the above four Examples. Thus, contact hole burial may be achieved with high reliability and reproducibility. This will be explained by referring to FIG. 8.

Figure 8:
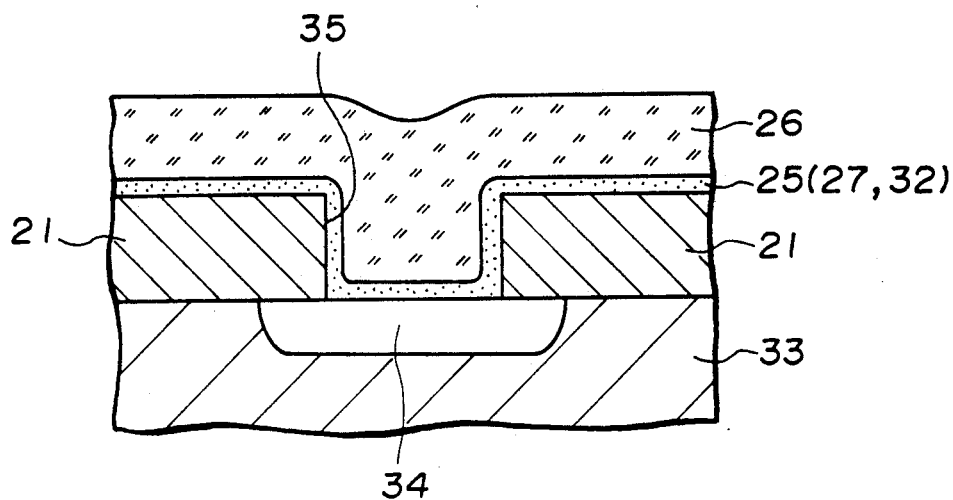
FIG. 8 is a schematic cross-sectional view showing the state in which the Al-1%Si layer has been buried satisfactorily in the contact hole having the barrier metal layer by the metallization method of the present invention.

In FIG. 8, an interlayer insulating film 21 having a contact hole 35 reaching an impurity diffusion region 34 previously formed on a silicon substrate 33 is formed on the silicon substrate 33. Then, a Ti/TiON/Ti system barrier metal layer 25, a Ti/TiON system barrier metal layer 27 or a Ti/TiON system barrier metal layer 32 is formed for covering the entire wafer surface, and finally the Al-1% Si layer 26 is formed to a thickness of 500 nm on the entire wafer surface.

Meanwhile, high temperature sputtering for forming the Al-1% Si layer 26 may be effected by a well-known one-stage or two-stage process.

The one-stage process may be effected under exemplary conditions of an Ar flow rate of 100 SCCM, a gas pressure of 0.47 Pa (3.5 mTorr), a DC sputtering power of 4.5 kW, a bias power of 0 V and a substrate temperature of 500° C.

In the above mentioned two-stage process, a film is deposited to a thickness of the order of 100 nm, under exemplary conditions of an Ar flow rate of 100 SCCM, a gas pressure of 0.47 Pa (3.5 mTorr), a DC sputtering power of 22.5 kW and an RF bias power of 0 V, with the substrate being not heated, after which a film is deposited to a thickness of the order of 400 nm under conditions of a DC sputtering power of 10.5 kW, an RF bias power of 300 V (13.56 MHz) and a substrate temperature of 500° C. The purpose of carrying out the deposition process in two steps and not heating the substrate at the initial step is to prevent crystal grain growth in the form of islands which is frequently noticed when the substrate is heated to an elevated temperature from the initial stage of film deposition.

Figure 3A:
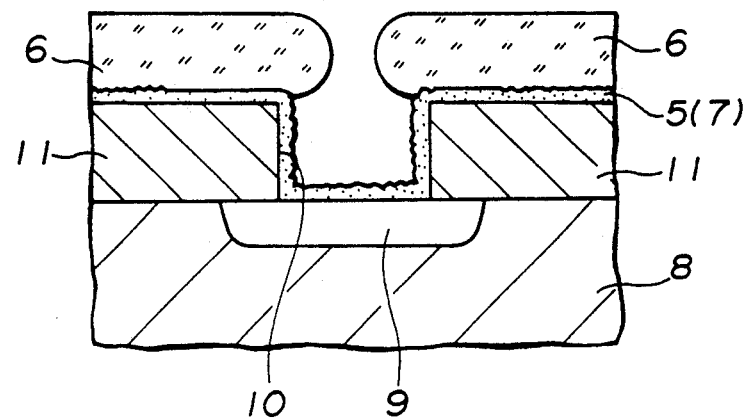
Figure 3B:
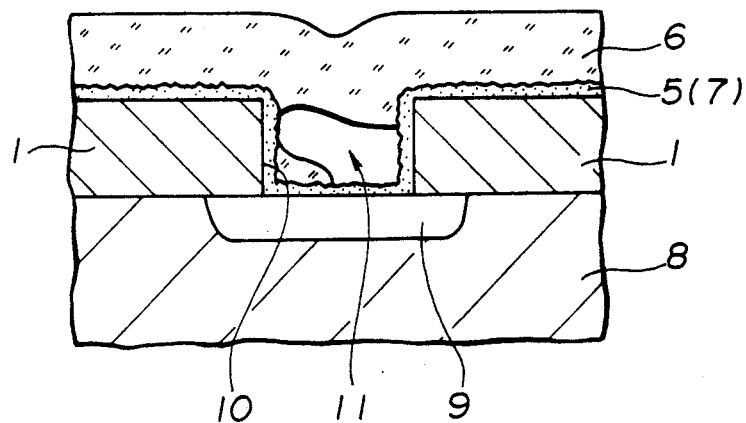

With any of the above methods, the contact hole 35 was uniformly buried with the Al-1%Si material layer 26 without generating voids 11 such as are shown in FIG. 3b. Besides, crystal grains of the Al-1% Si material layer 26 were coarsened reflecting the crystalline state of the surface layer regions of the barrier metal layers 25, 27 and 32, while the resistance to electro-migration of the Al-1%Si layer 26 was also improved.

What is claimed is:

1. A metallization method comprising the steps of coating at least the bottom and the sidewall of a connecting hole opened in an insulating film on a substrate with a barrier metal layer system including a Ti-based material layer, and then forming an Al-based material layer for filling at least said connecting hole, the improvement comprising performing an operation of increasing the crystal grain size of a surface layer of said barrier metal layer system during said step of coating with said barrier metal layer system.

2. A metallization method as claimed in claim 1 wherein said barrier metal layer system has a three-layered structure comprising a Ti layer; one layer selected from the group consisting of a TiON layer, a TiN layer and a TiW layer; and a Ti layer, stacked in this order.

3. A metallization method as claimed in claim 1 wherein said barrier metal layer system has a two-layered structure comprising a Ti layer and a layer selected from the group consisting of a TiON layer, a TiN layer and a TiW layer, stacked in this order.

4. A metallization method as claimed in claim 1 wherein said barrier metal layer system has a three-layered structure comprising a Ti layer; one layer selected from the group consisting of a TiON layer, a TiN layer and a TiW layer; and a $TiSi_2$ layer, stacked in this order.

5. A metallization method as claimed in claim 1 wherein said operation is bias sputtering.

6. A metallization method as claimed in claim 1 wherein said operation is laser irradiation.

7. A metallization method as claimed in claim 1 wherein said operation is lamp annealing.

* * * * *